(12) United States Patent
Chung et al.

(10) Patent No.: US 6,303,939 B1
(45) Date of Patent: Oct. 16, 2001

(54) WAFER MAPPING APPARATUS

(75) Inventors: Ping-Chung Chung, Hsinchu Hsien; Tsung-Lin Lu, Tainan Hsien, both of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/347,619

(22) Filed: Jul. 2, 1999

(51) Int. Cl.⁷ .................................................. G01N 21/86
(52) U.S. Cl. ................ 250/559.29; 356/614; 250/559.4; 414/935
(58) Field of Search ......................... 250/559.12, 559.13, 250/559.33, 559.29, 559.4; 198/395; 356/375, 614; 414/935–941

(56) References Cited

U.S. PATENT DOCUMENTS

| | | | |
|---|---|---|---|
| 4,803,373 | * | 2/1989 | Imamura et al. ................ 250/559.29 |
| 5,225,691 | * | 7/1993 | Powers et al. ...................... 250/559.4 |
| 5,239,182 | * | 8/1993 | Tateyama et al. ............... 250/559.37 |
| 6,097,492 | * | 8/2000 | Kondo et al. .......................... 356/375 |

* cited by examiner

*Primary Examiner*—Stephone B. Allen

(57) ABSTRACT

A semiconductor wafer cassette mapper. A photo-detecting array is used as a receiver. During a mapping process, an accurate and complex driving system is not necessary. The invention provides a semiconductor wafer cassette mapper. A strip light source is used as an emitter and a photo-detecting array is used as a receiver for a semiconductor wafer cassette mapper. During the mapping process, the strip light source, the photo-detecting array and the wafer cassette do not need to move for scanning. The receiver obtains an information about all wafers in the wafer cassette by receiving all signals at one time, so that a mapping time is reduced. The invention provides another semiconductor wafer cassette mapper. A parallel scanning light source serves as an emitter and a photo-detecting array serves as a receiver of semiconductor wafer cassette mapper. During the mapping process, the parallel scanning light source moves quickly to scan the wafers in the wafer cassette. The method can reduce the mapping time.

19 Claims, 7 Drawing Sheets

WAFER MAPPING APPARATUS

BACKGROUND OF THE INVENTION

1. Field of the Invention

The present invention relates to a semiconductor wafer mapping apparatus. More particularly, the present invention relates to a semiconductor wafer cassette mapper for detecting number and position of wafers in a wafer cassette.

2. Description of the Related Art

In order to reduce dust and contamination from a manufacturing process, an automatic mechanism is required to perform automatic processes. When a wafer cassette holding a number of wafers is placed in an appropriate position, a robotic arm transports the wafers between a wafer processing chamber and the wafer cassette. Several types of wafer cassettes are used to hold these wafers, depending on the particular process being performed. For example, Teflon wafer cassettes are employed to transport wafers while they are in chemical processes, and quartz wafer cassettes are employed to hold wafers during high temperature processes. In between these processing steps, automated transfer devices are used to transfer the wafers from one type of wafer cassette to another.

FIG. 1 is a schematic, three-dimensional illustration of the conventional semiconductor wafer cassette mapper.

Referring to FIG. 1, a semiconductor wafer cassette 100, capable of holding a full complement of twenty-five wafers 101, is shown. Each of the wafers 101 is disposed horizontally in evenly-spaced slots 103 located on each sidewall of wafer cassette 100.

While performing the semiconductor process, number and position of the wafers in the wafer cassette depend on the process performed on the wafers. A semiconductor wafer cassette mapper for detecting number and position of wafers in a wafer cassette is required to enable a robotic arm to accurately remove and place wafers in the wafer cassette. Conventionally, an emitter apparatus is located at one side of wafer cassette 100 and a receiver apparatus is located at the opposite side thereof. The emitter apparatus is leveled with the receiver apparatus, and the wafer cassette 100 is stationary between the emitter apparatus and the receiver apparatus. The emitter apparatus and the receiver apparatus move up and down simultaneously at a constant rate to scan the wafers 101 (or the emitter apparatus and the receiver apparatus are stationary, and the wafer cassette moves up and down at a constant rate). The presence or absence of a wafer 101 in the wafer cassette 100 is determined by whether a beam from the emitter apparatus is detected by the receiver, or not. Moreover, a double slot effect that multiple wafers 101 are stacked or a cross slot effect that a wafer 101 is not placed horizontally can probably be determined by the wafer cassette mapper.

The position of the wafers is scanned by moving either the wafer cassette, or the emitter and the receiver. However, no matter which mechanism is used, the speed of moving elements must be controlled accurately to prevent deviation of mapping or sway of the wafers in the wafer cassette. As a result, a complex and accurate driving system is used. FIG. 2 is a schematic, three-dimensional illustration of the conventional driving system for controlling a wafer cassette moving up or down. These complex parts are not described herein since they are not closely related to the scope of the present invention. The complicate mechanism fails easily, causing equipment shutdown or incorrect mapping results. For preventing deviation of mapping or sway of the wafers under mapping process, it is necessary to control cassette a slow travelling rate, thus time of wafer mapping is further increased and wafer throughput is decreased.

SUMMARY OF THE INVENTION

Accordingly, the present invention is to provide a semiconductor wafer mapping apparatus. The semiconductor wafer mapping apparatus comprises a cassette mapper with an increased mapping efficiency without the implementation of a complex driving system. Moreover, the device can increase in mapping speed and more reliable.

To achieve these and other advantages and in accordance with the purpose of the invention, as embodied and broadly described herein, the invention provides a semiconductor wafer cassette mapper. A photo-detecting array is used as a receiver for the semiconductor wafer cassette mapper. During a mapping process, the cassette and receiver are relatively stationary, and the complex and accuracy driving system is not required, so that probability for deviation of mapping is reduced.

To achieve these and other advantages and in accordance with the purpose of the invention, as embodied and broadly described herein, the invention provides a semiconductor wafer cassette mapper. A wafer cassette holding a number of wafers is provided. A strip light source is used as an emitter, and a photo-detecting array is used as a receiver for the semiconductor wafer cassette mapper. During a mapping process, the strip light source, the photo-detecting array and the wafer cassette do not need to move for scanning. The strip light source emits a parallel light, and the parallel light is parallel to the wafers and passes through the wafer cassette. Then, the photo-detecting array obtains an information of all wafers by receiving the parallel light at one time. Since the information is obtained at one time, the mapping time is reduced.

To achieve these and other advantages and in accordance with the purpose of the invention, as embodied and broadly described herein, the invention provides a semiconductor wafer cassette mapper. A wafer cassette holding a number of wafers is provided. A parallel scanning light source serves as an emitter and a photo-detecting array serves as a receiver of a semiconductor wafer cassette mapper. During the mapping process, the parallel scanning light source emits a parallel beam, which means a beam with parallel scanning, and the parallel beam is incident and parallel to the wafers. The parallel scanning light source moves vertically to mapping the wafers in the wafer cassette. The photo-detecting array receives the parallel beam. Since the linear photo-detecting array is inherent position discrimination, an information of all wafers is obtained. Since it does not need complex mechanism and accuracy speed control, the parallel scanning light source can move speedily to scan the wafers. As a result, the mapping is also fast.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
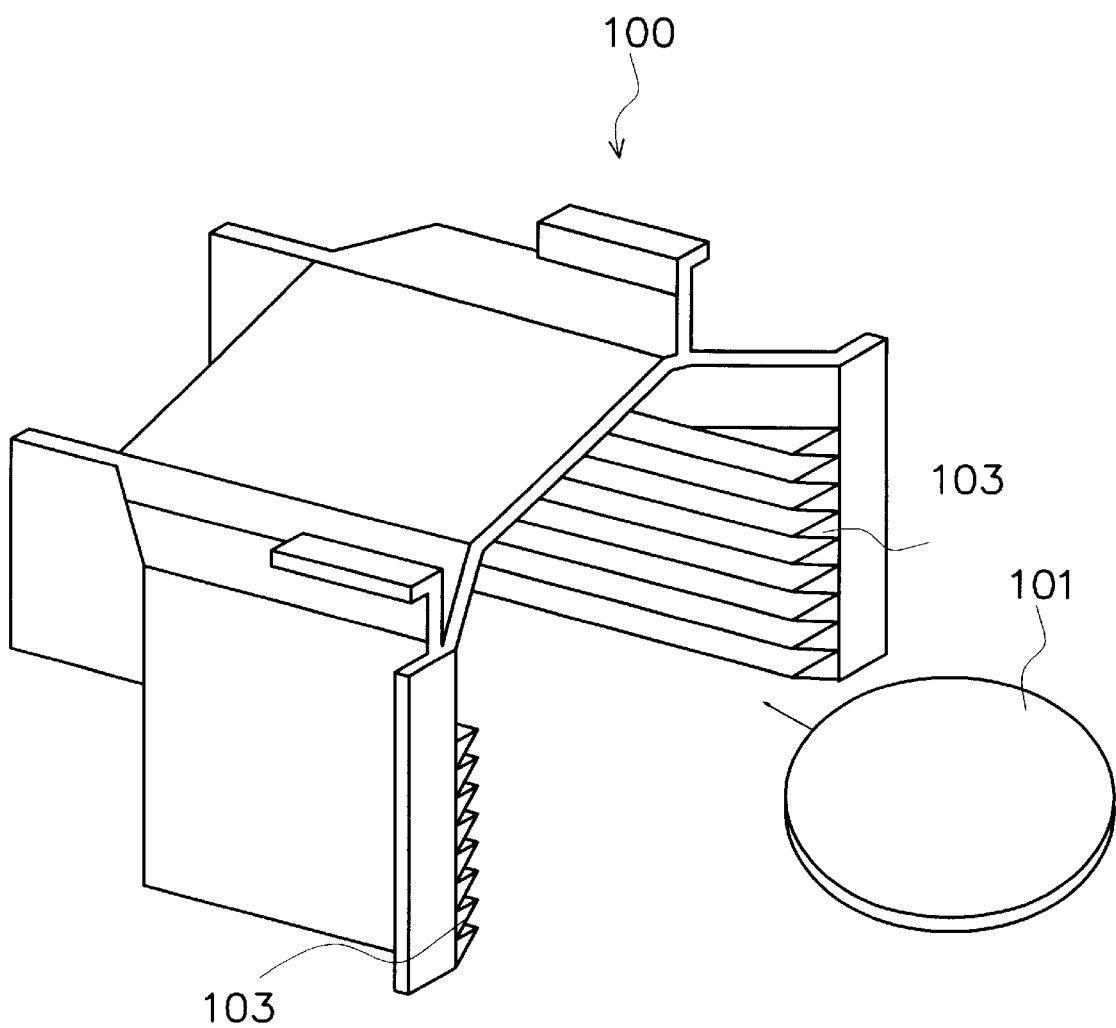
FIG. 1 is a schematic, three-dimensional illustration of a conventional semiconductor wafer cassette.
Figure 2:
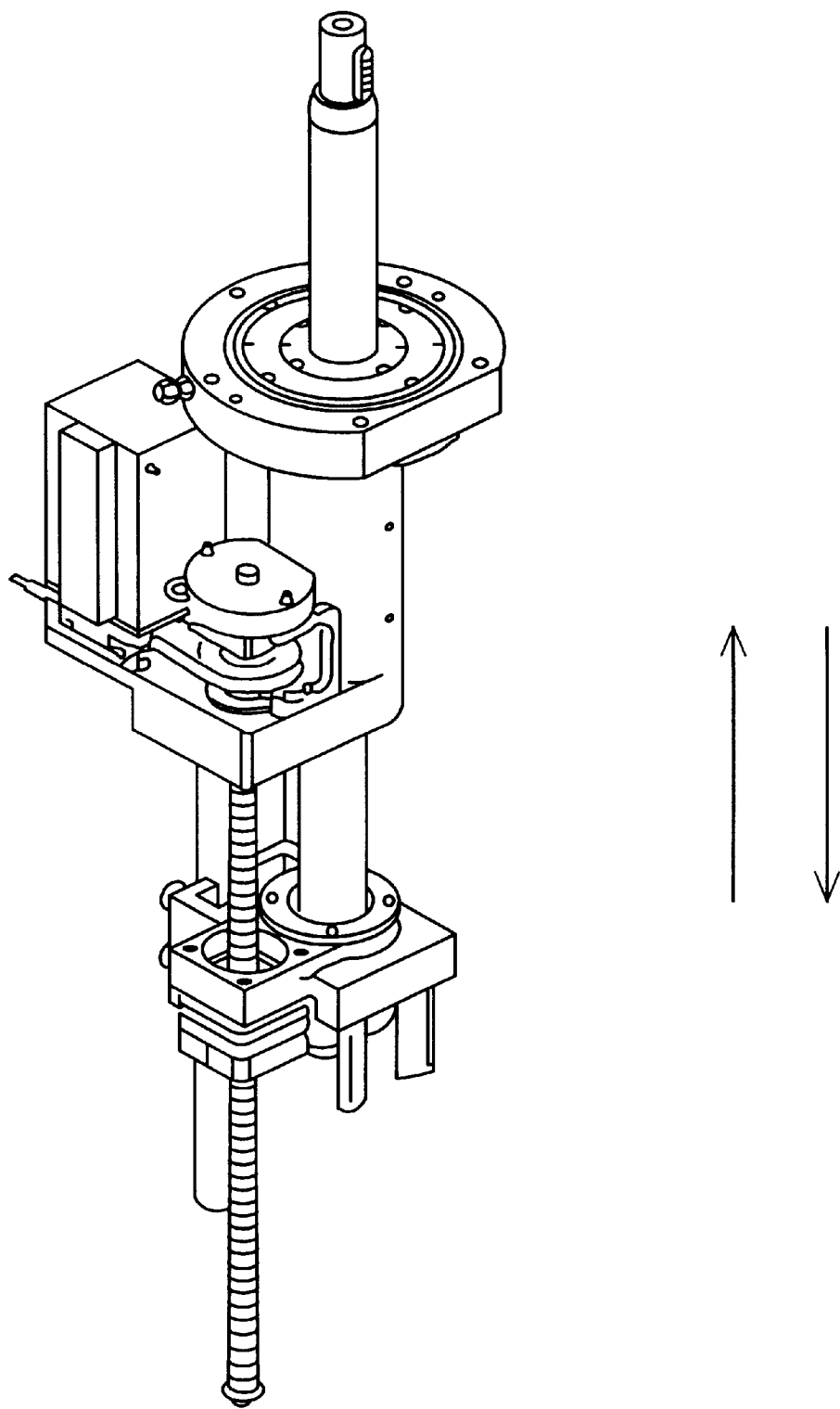
FIG. 2 is a schematic, three-dimensional illustration of the conventional driving system structure for controlling a wafer cassette for mapping.

Reference will now be made in detail to the present preferred embodiments of the invention, examples of which are illustrated in the accompanying drawings. Wherever possible, the same reference numbers are used in the drawings and the description to refer to the same or like parts.

Figure 3:
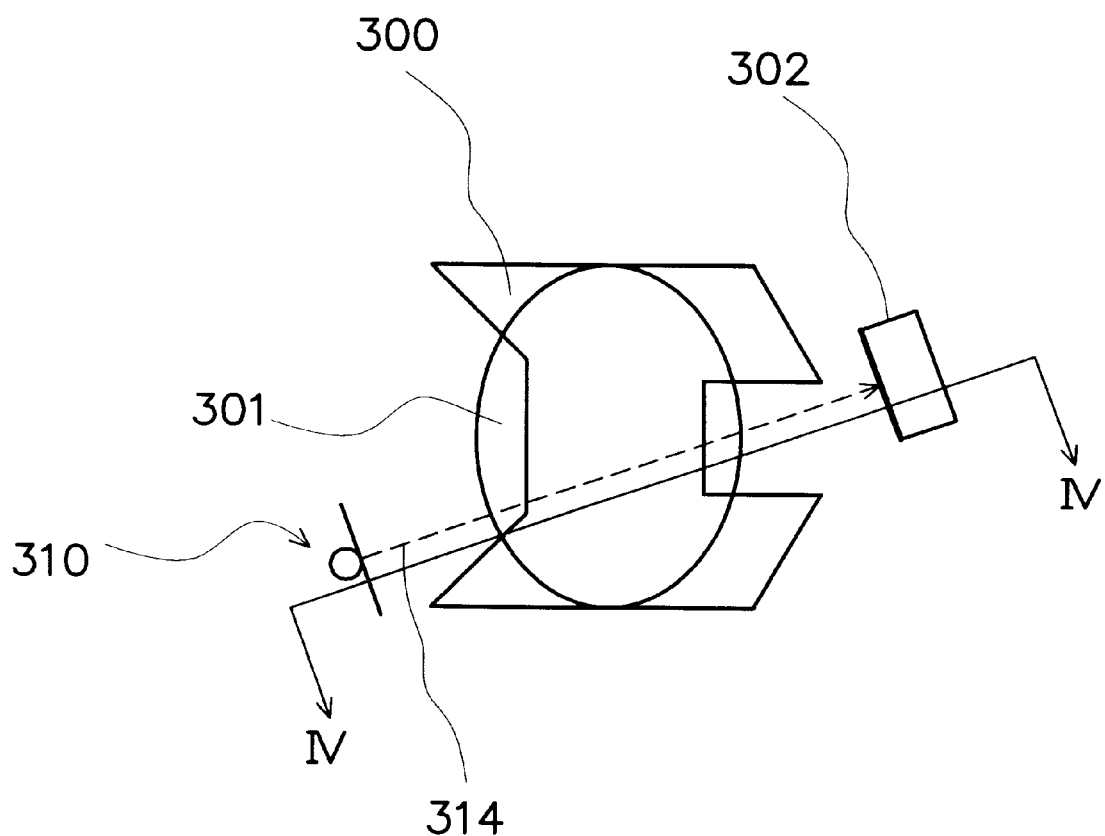
FIG. 3 is a schematic top view of the semiconductor wafer cassette mapper, according to a preferred embodiment of this invention.
Figure 4:
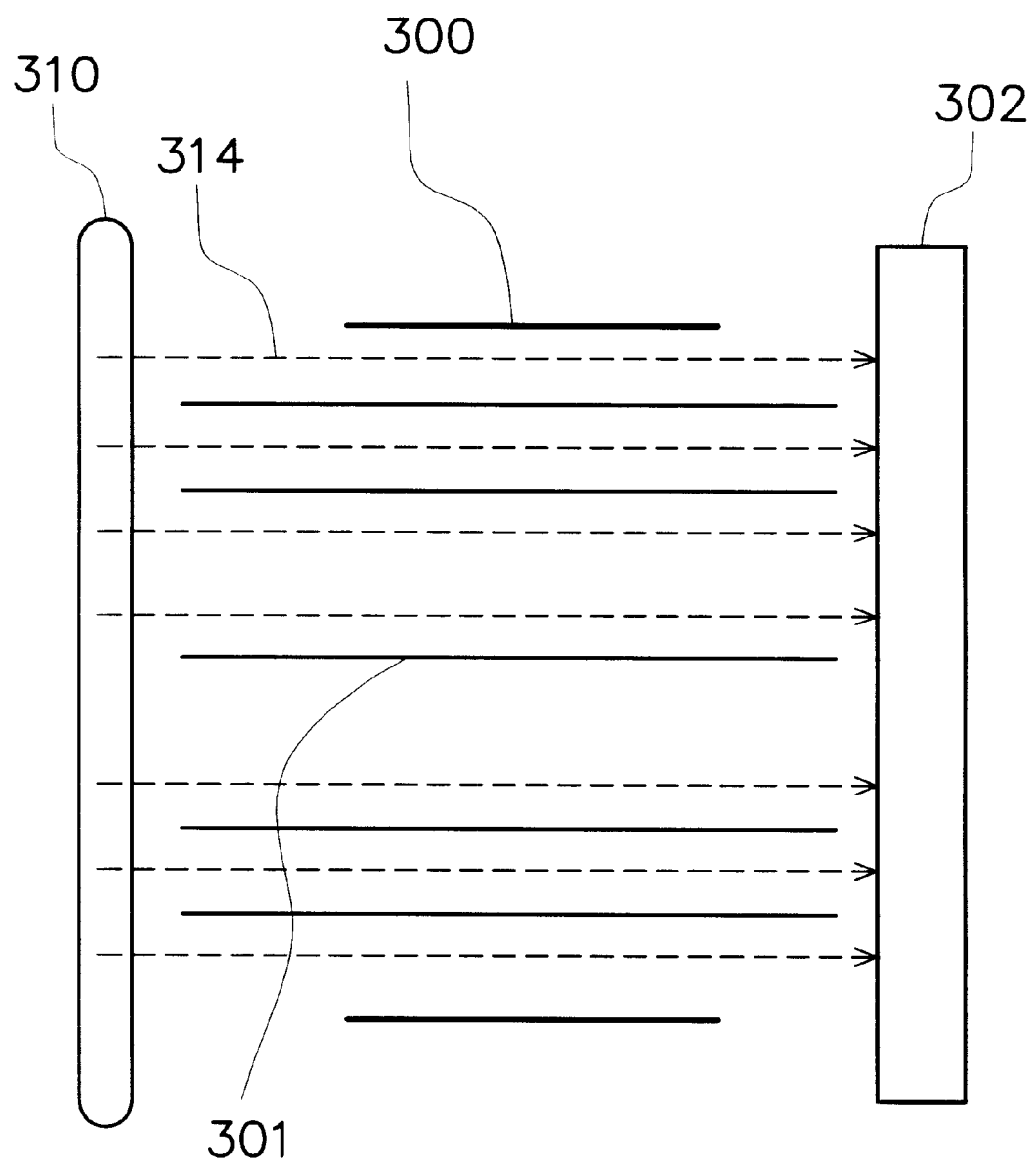
FIG. 4 is a schematic cross-sectional view of the semiconductor wafer cassette mapper of FIG. 3, taken along line IV—IV, according to a first preferred embodiment of this invention.

FIG. 3 is a schematic top view of the semiconductor wafer apparatus, for example, a cassette mapper according to a preferred embodiment of this invention. FIG. 4 is a schematic cross-sectional view of the semiconductor wafer cassette mapper of FIG. 3, taken along line IV—IV, according to the first preferred embodiment of this invention. Referring to the pictorial diagrams of FIGS. 3 and 4, a semiconductor wafer cassette 300 is shown to be capable of holding a number of wafers 301. The wafers 301 are coaxially disposed in the wafer cassette 300, and each of the wafers 301 is disposed horizontally in evenly-spaced slots (in a similar way of the slots 103 as shown in FIG. 1) located along each sidewall of the wafer cassette 300. There is an interval between the adjacent wafers 301. As a result, a light can pass through the intervals. A light source 310, such as a strip light source, is provided at one side of the wafer cassette 300, wherein a parallel light 314 is generated from the light source 310. The cross-section of the parallel light 314 is rectangular. A photo-detecting array 302 opposite to the light source 310 is positioned at the other side of the wafer cassette 300. The parallel light 314 is perpendicular to an axis of the wafers 301 and passes through the wafer cassette 300. The photo-detecting array 302 receives the parallel light 314. The photo-detecting array 302 generally comprises many sensors arranged in a line. For example, a linear charge coupled device (CCD) array is employed as the photo-detecting array 302. The resolution of the linear charge coupled device array can reach a sub-micron level, so that a position of the wafers 301 in the wafer cassette 300 detected by the linear charge coupled device array is sufficiently accurate. The size of the photo-detecting array 302 depends on the capacity of the wafer cassette 300. More specifically, the coverage of the light source 310, and the receiving range of the photo-detecting array 302 covers the area of the wafer cassette 300. Therefore, the positions for disposing the wafers 301 can all be lighted with the light source 310 and detected by the photo-detecting array 302.

During mapping, the parallel light 314 is emitted from the light source 310 and passes through the wafer cassette 300. The parallel light 314 is received by the photo-detecting array 302. When the wafers 301 are positioned in the wafer cassette 300, of the parallel light 314 are blocked by the wafers 301. Thus, sensors of the photo-detecting array 302 aligned with the wafers 301 do not receive the parallel light 314. Otherwise, sensors of the photo-detecting array 302 aligned with the positions without being filled by the wafers 301 receive the parallel light 314. As a result, an information regarding number and position of the wafers 301 in the wafer cassette 300 is obtained by this way. Additionally, the double slot effect or the cross slot effect is also detected by the mechanism because the length that parallel light 314 be blocked by double or cross slot wafers is wider than normal wafer 301. This prevents the robot from breaking the wafers 301 by an information about the double slot effect and the cross slot effect.

In the invention, the sensors of the photo-detecting array 302 are aligned parallel to the wafer stack. Not only the information regarding the number and the position of the wafers 301 but also the double slot effect and the cross slot effect are detected simultaneously during one mapping process by the parallel light 304.

Furthermore, lengths of the photo-detecting array 302 and the strip light source 310 are substantially the same as or larger than the wafer cassette 300, so that the number and the position of the wafers 301 stored in the wafer cassette 300 are detected and recorded at one time. The wafer cassette 300 and the photo-detecting array 302 do not need to move when mapping, so that mapping time is reduced.

Figure 6A:
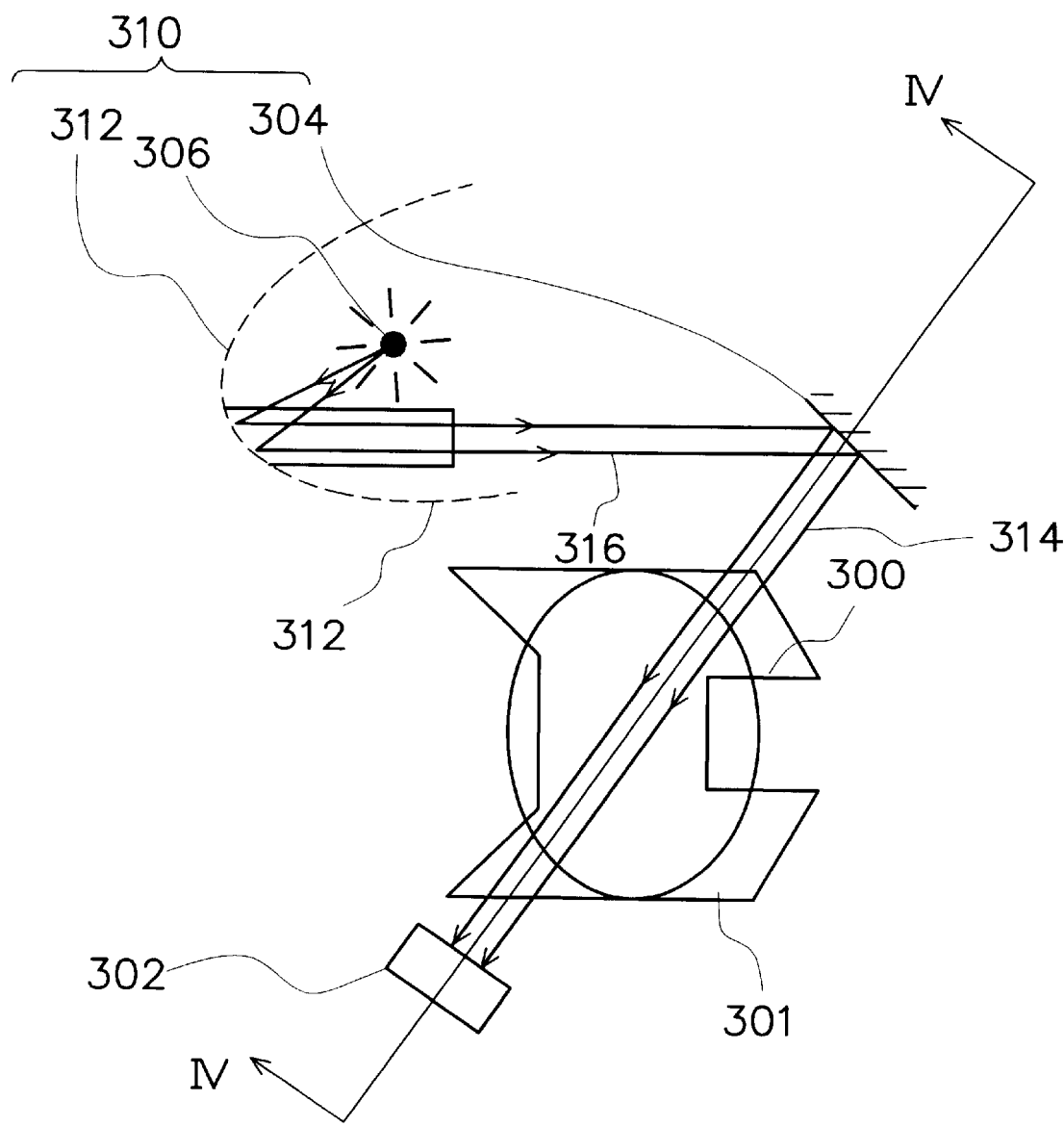
FIG. 6A is a schematic top view of the semiconductor wafer cassette mapper using a strip light source according to a first preferred embodiment of this invention.
Figure 6B:
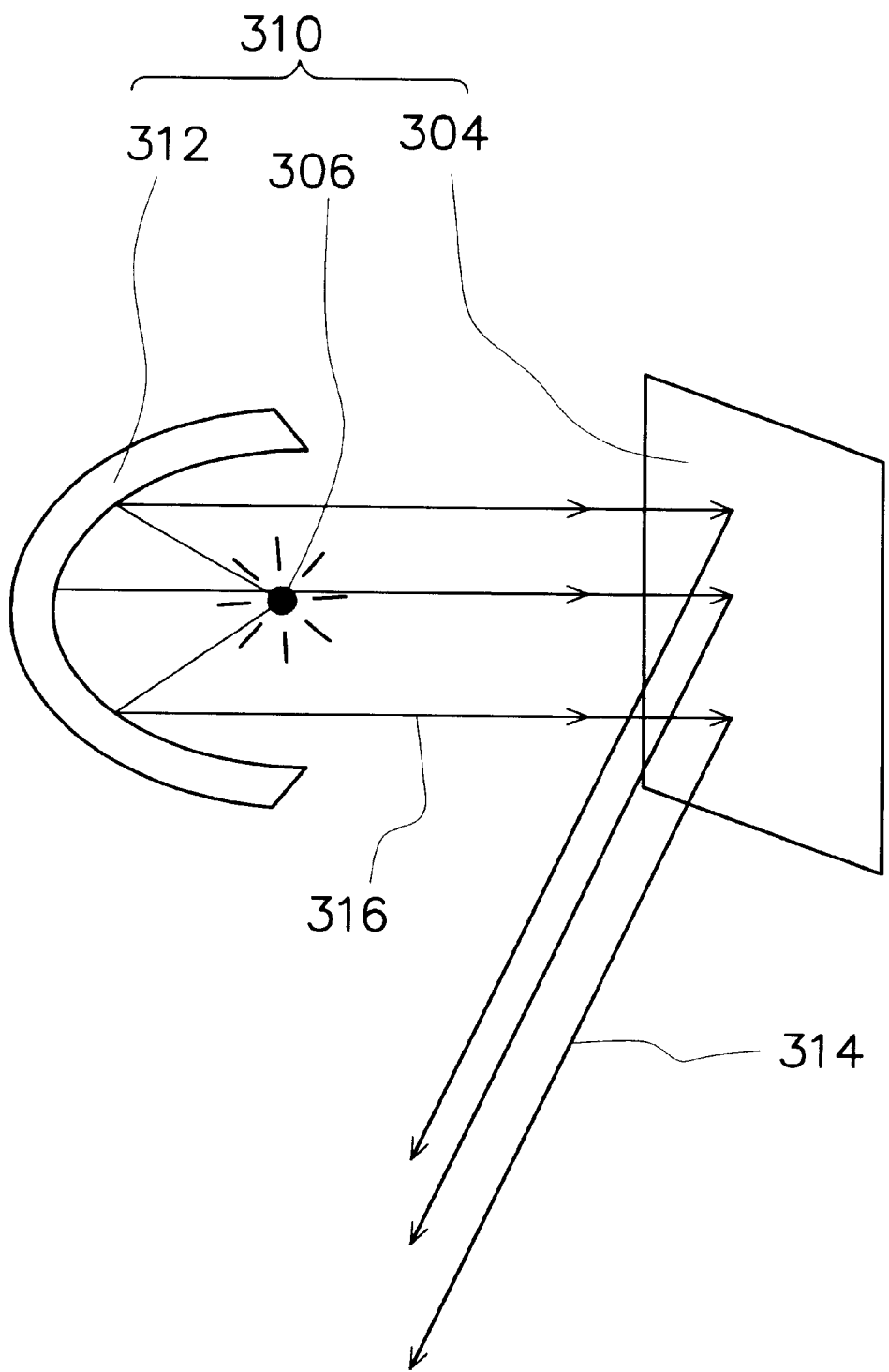
FIG. 6B is a schematic side view of the strip light source of FIG. 6A.

The strip light source 310 used in this embodiment is manufactured as illustrated in FIGS. 6A and 6B. FIG. 6A is top view and FIG. 6B is side view of the semiconductor wafer cassette mapper using a strip light source according to the first preferred embodiment of this invention. A paraboloidal mirror 312 is provided. A point light 306 is set at a focus of the paraboloidal mirror 312. Therefore, the paraboloidal mirror 312. Therefore, the parabolodical mirror 312 reflects light emitted from the point light 306 as a parallel light 316. A plane mirror 304, such as a rectangular plane mirror, is provided along an optical path of the parallel light 316, and the parallel light 316 is incident upon the plane mirror 304. By adjusting an angle and a location of the plane mirror 304, the parallel light 316 is reflected from the plane mirror 304 as a strip parallel light 314 to pass through the wafer cassette 300 to the photo-detecting array 302. The paraboloidal mirror 312, the point light 306 and the plane mirror 304 constitute the strip light source 310.

Figure 5:
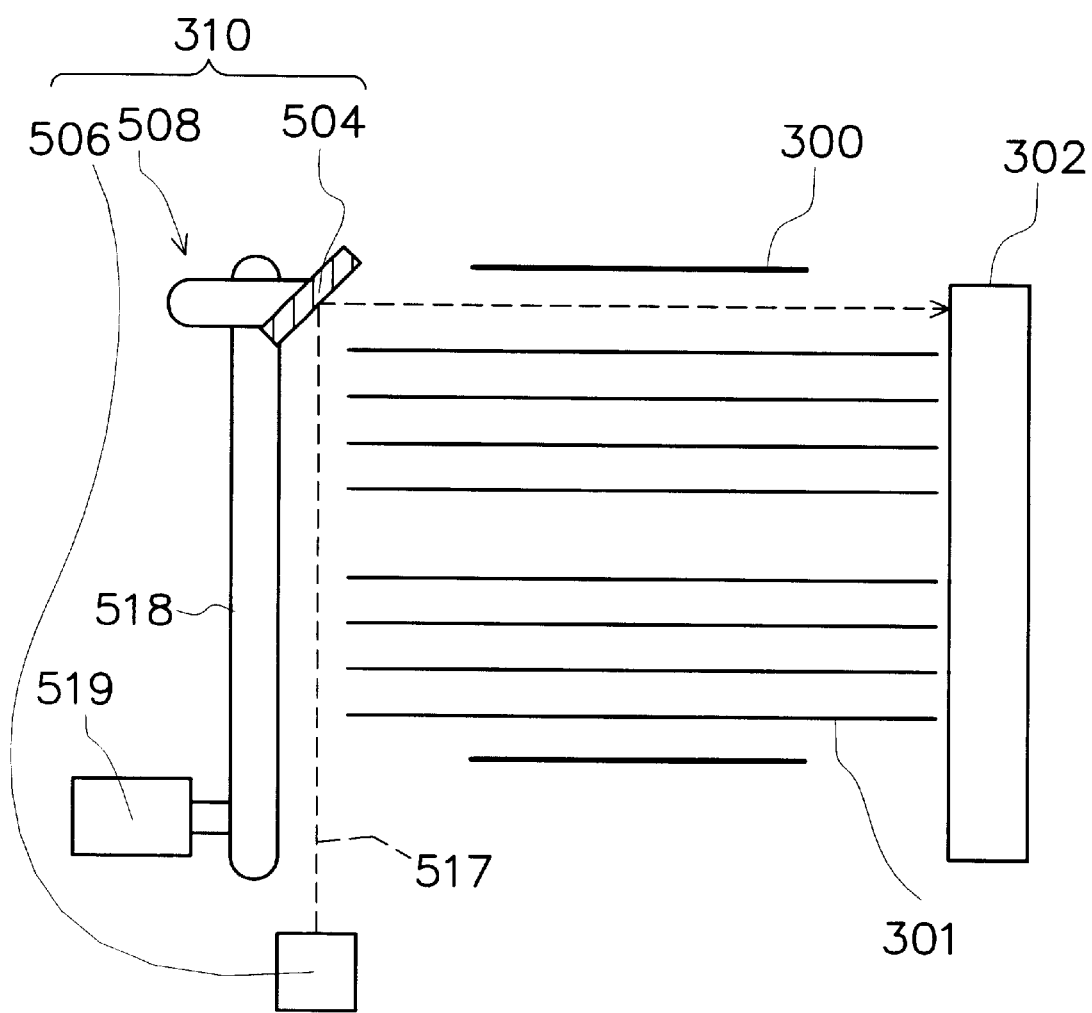
FIG. 5 is a schematic cross-sectional view of the semiconductor wafer cassette mapper of FIG. 3, taken along line IV—IV, according to a second preferred embodiment of this invention.

In a second embodiment, a parallel scanning light source is used. Because the parallel scanning light source looks the same to the strip light source 310 in the schematic top-view diagram, FIG. 3 is also used to illustrate a parallel scanning light source in this second embodiment. FIG. 5 is a schematic cross-sectional view of the semiconductor wafer cassette mapper of FIG. 3, taken along line IV-IV, according to the second preferred embodiment of this invention.

Referring to the schematic diagrams of FIGS. 3 and 5, the semiconductor wafer cassette 300 capable of holding a number of wafers 301 is shown. Each of the wafers 301 is positioned horizontally in evenly-spaced slots (similar to the slots 103 shown in FIG. 1) located along etch sidewall of wafer cassette 300, wherein the wafers 301 are coaxially disposed in the wafer cassette 300. There is an interval between adjacent wafers 301. A parallel beam can pass through the interval. A parallel scaning light source 310 is provided at one side of the wafer cassette 300. A beam 517 is generated from a light source 506. A photo-detecting array 302 opposite to the parallel scanning light source 310 is provided at the other side of the wafer cassette 300. For example, a linear charge coupled device (CCD) array is employed as the photo-detecting array 302. The parallel beam 517 is perpendicular to an axis of the wafers 301. The parallel beam 517 passes through the wafer cassette 300, and then the photo-detecting array 302 receives the parallel beam 517.

The light source 310 used in this second embodiment is made from, for example, a driving system 508 having a drive rail 518 and a power device 519. The driving system 508 is mounted at the opposite side of the photo-detecting array 302. A plane mirror 504 is mounted on the drive rail 518 of the driving system 508. A linear moving path of the plane mirror 504 is parallel to the axis of the wafers 301. That is, the plane mirror 504, driven by the driving system 508, moves along a direction of the axis of the wafers 301 along the drive rail 518. The light source 506, such as a laser, is provided to generate the parallel beam 517. The light source 506 is aligned with the plane mirror 504. By adjusting an angle of the plane mirror 504 and a location of the light source 506, the parallel beam 517 generated from the light source 506 is reflected from the plane mirror 504 and passes through the wafer cassette 300. The moving path of the plane mirror 504 has to be long enough to cover the wafer cassette 300. The driving system 508, the plane mirror 504 and the light source 506 constitute the parallel scanning light source 310.

During mapping, the parallel beam 517 is generated from the light source 506 and reflected by the plane mirror 504. The parallel beam 517 passes through the wafer cassette 300. The parallel beam 517 is received by the photo-detecting array 302. Then, number and position of the wafers 301 in the wafer cassette 300 are detected by moving the plane mirror 504 up or down. When a wafer 301 is positioned on the path of the parallel beam 517, the parallel beam 517 is blocked and a sensor of the photo-detecting array 302 aligned with the wafer 301 (not shown) does not receive the parallel beam 517. Otherwise, the sensor of the photo-detecting array 302 aligned with the intervals (not shown) can receive the particular parallel beam 517. As a result, an information regarding number and position of the wafers 301 in the wafer cassette 300 is obtained by this way. Additionally, the double wafers or the cross slot effect is also detected by the mechanism because a larger number of photodiodes of the photo-detecting array 302 do not receive the parallel beam 517. This prevents the robot from breaking the wafers 301 by an information about the double slot effect and the cross slot effect.

The second embodiment of this invention provides a linear charge coupled device array whose length is a longer than the wafer cassette 300 as a receiver, so that the linear charge coupled device array need not move. The mapping process is performed by only moving the plane mirror 504. The plane mirror 504 not only moves speedily to scan the wafers, but also need not move at a constant rate. Therefore, a complex driving system is unnecessary. Additionally, the mapping time and the cost are reduced.

The invention provides a linear charge coupled device array as a receiver. The wafer cassette or the receiver need not move, so that a driving system can be eliminated.

The invention provides a strip light source. The strip light source is not required to move. The information regarding number and the position of the wafers stored in the wafer cassette are obtained and recorded at one time. Therefore, the mapping time is reduced.

The invention provides a parallel scanning light source. The operation is simple and a speed control device is not necessary. Additionally, speed of mapping is fast. Therefore, the mapping time is reduced.

The invention provides a linear charge coupled device array as a receiver. The presence or absence of a wafer on a wafer cassette is detected in accordance with the position of the receiver and signals received by the receiver. Therefore, the double slot effect or the cross slot effect is detected by the mechanism and prevents the robot from breaking the wafers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor wafer cassette mapper for detecting position of a wafer in a wafer cassette, wherein wafers are coaxially disposed in the wafer cassette and a plurality of intervals are formed between the adjacent wafers, the wafer cassette mapper comprising:

a photo-detecting array mounted at one side of the wafer cassette; and a strip light source, wherein a parallel light generated from the strip light source is perpendicular to an axis of the wafers and passes through the wafer cassette to the photo-detecting array, wherein the strip light source further comprises:

a paraboloidal mirror;

a point light source located at a focus of the paraboloidal mirror, wherein the paraboloidal mirror reflects a light generated from the point light source to generate a strip parallel light; and a plane mirror, wherein the paraboloidal mirror reflects light generated from the point light source to generate the parallel light, the parallel light is incident upon the plane mirror, and the parallel light reflected from the plane mirror passes through the wafer cassette to the photo-detecting array.

2. The semiconductor wafer cassette mapper of claim 1, wherein the photo-detecting array includes a linear charge coupled device.

3. The semiconductor wafer cassette mapper of claim 1, wherein a length of the photo-detecting array is longer than the wafer cassette.

4. The semiconductor wafer cassette mapper of claim 1, wherein a length of the strip light source is longer than the wafer cassette.

5. A semiconductor wafer cassette mapper for detecting position of a wafer in a wafer cassette, wherein the wafers are coaxially disposed in the wafer cassette and a plurality of intervals are formed between the adjacent wafers, the wafer cassette mapper comprising:

a photo-detecting array mounted at one side of the wafer cassette; and a parallel scanning light source, wherein a beam generated from the parallel scanning light source is perpendicular to an axis of the wafers and passes through the wafer cassette to the photo-detecting array.

6. The semiconductor wafer cassette mapper of claim 5, wherein the photo-detecting array includes a linear charge coupled device.

7. The semiconductor wafer cassette mapper of claim 5, wherein a length of the photo-detecting array is longer than the wafer cassette.

8. The semiconductor wafer cassette mapper of claim 5, wherein the parallel scanning light source further comprises:

a driving system;

a plane mirror mounted on the driving system, wherein a moving path of the plane mirror is parallel to an axis of the wafers and the plane mirror moves linearly; and a light source aligned with the plane mirror generating a parallel beam, wherein the parallel beam reflected from the plane mirror passes through the wafer cassette to the photo-detecting array by adjusting an angle of the plane mirror and a location of the light source, and a moving length of the plane mirror is a longer than a length of the wafer cassette.

9. The semiconductor wafer cassette mapper of claim 8, wherein the light source includes a laser.

10. The semiconductor wafer cassette mapper of claim 8, wherein the driving system further comprises:

a drive rail, wherein a plane mirror moves on the drive rail; and a power device mounted on the drive rail, wherein the power device drives the plane mirror.

11. A semiconductor wafer cassette mapper for detecting a position of a wafer in a wafer cassette, wherein the wafers are coaxially disposed in the wafer cassette and a plurality of intervals are formed between the adjacent wafers, the wafer cassette mapper comprising:

a photo-detecting array mounted at one side of the wafer cassette; and a light source, wherein a parallel light generated from the light source is perpendicular to an axis of the wafers and parallel to the wafers, and the parallel light passes through the wafer cassette to the photo-detecting array.

12. The semiconductor wafer cassette mapper of claim 11, wherein the photo-detecting array includes a linear charge coupled device.

13. The semiconductor wafer cassette mapper of claim 11, wherein a length of the photo-detecting array is longer than the wafer cassette.

14. The semiconductor wafer cassette mapper of claim 11, wherein the light source includes a strip light source.

15. The semiconductor wafer cassette mapper of claim 14, wherein a length of the strip light source is longer than the wafer cassette.

16. The semiconductor wafer cassette mapper of claim 14, wherein the strip light source further comprises:

a paraboloidal mirror;

a point light source located at a focus of the paraboloidal mirror, wherein the paraboloidal mirror reflects light generated from the point light source to form a parallel light; and a plane mirror, wherein the paraboloidal mirror reflects the light generated from the point light source to generate the parallel light, the parallel light is incident upon the plane mirror, and the parallel light reflected from the plane mirror passes through the wafer cassette to the photo-detecting array.

17. The semiconductor wafer cassette mapper of claim 11, wherein the light source includes a parallel scanning light source.

18. The semiconductor wafer cassette mapper of claim 17, wherein the parallel scanning light source further comprises:

a driving system;

a plane mirror mounted on the driving system, wherein a moving path of the plane mirror is parallel to an axis of the wafers and the plane mirror moves linearly; and a light source aligned with at the plane mirror for generating a parallel beam, wherein the parallel beam parallel to the wafers is reflected from the plane mirror and passes through the wafer cassette to the photo-detecting array by adjusting an angle of the plane mirror and a location of the light source, and a moving length of the plane mirror is a longer than that of the wafer cassette.

19. The semiconductor wafer cassette mapper of claim 18, wherein the light source includes a laser.

\* \* \* \* \*